US011706933B2

(12) United States Patent
Hsu et al.

(10) Patent No.: US 11,706,933 B2
(45) Date of Patent: Jul. 18, 2023

(54) SEMICONDUCTOR MEMORY DEVICE AND FABRICATION METHOD THEREOF

(71) Applicant: UNITED MICROELECTRONICS CORP., Hsin-Chu (TW)

(72) Inventors: Wen-Hsin Hsu, Chiayi (TW); Ko-Chi Chen, Taoyuan (TW); Tzu-Yun Chang, Hsinchu County (TW); Chung-Tse Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 300 days.

(21) Appl. No.: 17/224,140

(22) Filed: Apr. 7, 2021

(65) Prior Publication Data
US 2022/0293679 A1 Sep. 15, 2022

(30) Foreign Application Priority Data
Mar. 11, 2021 (TW) .................................. 110108735

(51) Int. Cl.
*H10B 63/00* (2023.01)
*H10N 70/20* (2023.01)
*H10N 70/00* (2023.01)

(52) U.S. Cl.
CPC ............. *H10B 63/80* (2023.02); *H10B 63/30* (2023.02); *H10N 70/041* (2023.02); *H10N 70/24* (2023.02); *H10N 70/8833* (2023.02)

(58) Field of Classification Search
CPC ....... H10B 63/30; H10B 63/80; H10N 70/041
See application file for complete search history.

(56) References Cited

U.S. PATENT DOCUMENTS

| 10,297,749 | B1 * | 5/2019 | Hashemi | H10N 70/826 |
| 2018/0108837 | A1 * | 4/2018 | Hsu | H10N 70/063 |
| 2018/0205013 | A1 * | 7/2018 | Yi | H10N 70/8833 |

FOREIGN PATENT DOCUMENTS

WO WO-2019066849 A1 * 4/2019 ......... H01L 27/2436

\* cited by examiner

*Primary Examiner* — Marvin Payen
(74) *Attorney, Agent, or Firm* — Winston Hsu (57) ABSTRACT

A semiconductor memory device includes a substrate, a dielectric layer on the substrate, and a contact plug in the dielectric layer. An upper portion of the contact plug protrudes from a top surface of the dielectric layer. The upper portion of the contact plug acts as a first electrode. A buffer layer is disposed on the dielectric layer and beside the upper portion of the contact plug. A resistive-switching layer is disposed beside the buffer layer. A second electrode is disposed beside the resistive-switching layer.

20 Claims, 9 Drawing Sheets

SEMICONDUCTOR MEMORY DEVICE AND FABRICATION METHOD THEREOF

BACKGROUND OF THE INVENTION

1. Field of the Invention

The present invention relates to the field of semiconductor technology, and particularly relates to a resistive random access memory (RRAM) device and a manufacturing method thereof.

2. Description of the Prior Art

Resistive RAM (RRAM) is a general name for two-terminal reprogrammable devices that can be set to either a low or high resistance state. RRAM generally consists of a dielectric layer disposed between two electrodes. Some types of RRAM conduct by forming a distinct filament in a limited area of the dielectric. Other types of RRAM conduct by changing the properties of the dielectric throughout its area.

RRAM stores data by using the variable resistance characteristic of a dielectric layer interposed between two electrodes. Such dielectric layer, as a resistive layer, is normally insulating but can be made to be conductive through a filament or conduction path formed after application of a sufficiently high voltage, i.e. through a forming process. The conduction path formation can arise from different mechanisms, including defects, metal migration, etc. Once the filament is formed, it may be reset (i.e. broken, resulting in high resistance) or set (i.e. re-formed, resulting in lower resistance) by an appropriately applied voltage.

Typically, RRAM structure has a vertical configuration with a single transistor and a single resistor. Because a large current is required, the size of the memory cell is affected by the transistor. In addition, the RRAM structure requires the bottom electrode, the resistive-switching layer, and the top electrode to be fabricated in the memory area. Therefore, compared with the peripheral circuit area, there is an extra thickness of the inter-metal dielectric layer in the memory area. Therefore, gap filling of the low dielectric constant layer becomes a problem.

SUMMARY OF THE INVENTION

It is one object of the present invention to provide a semiconductor memory device and a manufacturing method thereof to solve the above-mentioned drawbacks or shortcomings of the prior art.

One aspect of the present invention provides a semiconductor memory device including a substrate, a dielectric layer on the substrate, and a contact plug in the dielectric layer. An upper portion of the contact plug protrudes from a top surface of the dielectric layer. The upper portion of the contact plug acts as a first electrode. A buffer layer is disposed on the dielectric layer and beside the upper portion of the contact plug. A resistive-switching layer is beside the buffer layer. A second electrode is beside the resistive-switching layer.

According to some embodiments, the contact plug is electrically connected to a drain doped region of a transistor on the substrate, wherein the transistor comprises a gate electrode, a source doped region and the drain doped region.

According to some embodiments, the second electrode is electrically connected to a bit line extending along a first direction, and the source doped region is electrically connected to a source line in the substrate, wherein the source line extends along a second direction.

According to some embodiments, the first direction is orthogonal to the second direction.

According to some embodiments, a top surface of the upper portion of the contact plug is coplanar with a top surface of the buffer layer, a top surface of the resistive-switching layer, and a top surface of the second electrode.

According to some embodiments, the buffer layer is a spacer buffer layer surrounding the upper portion of the contact plug.

According to some embodiments, the resistive-switching layer comprises a vertical portion on the spacer buffer layer and a horizontal portion on the dielectric layer.

According to some embodiments, the contact plug comprises tungsten.

According to some embodiments, the buffer layer comprises a metal or a conductive transition metal oxide.

According to some embodiments, the metal comprises Al, Ti, Ta, Au, Ag, Pt, W, Ni, Ir or Cu.

According to some embodiments, the conductive transition metal oxide comprises $NiO_x$, $Ta_yO_x$, $TiO_x$, $HfO_x$, $WO_x$, $ZrO_x$, $Al_yO_x$, $SrTiO_x$, $Nb_yO_x$, or $Y_yO_x$.

According to some embodiments, the resistive-switching layer comprises $NiO_x$, $Ta_yO_x$, $TiO_x$, $HfO_x$, $WO_x$, $ZrO_x$, $Al_yO_x$, $SrTiO_x$, $Nb_yO_x$, or $Y_yO_x$.

According to some embodiments, the second electrode comprises TiN or TaN.

Another aspect of the present invention provides a memory layout including a transistor comprising a source doped region and a drain doped region, a contact plug acting as a first electrode on the drain doped region, a buffer layer surrounding the contact plug, a resistive-switching layer surrounding the buffer layer, and a second electrode beside the resistive-switching layer.

According to some embodiments, the buffer layer is a spacer buffer layer surrounding an upper portion of the contact plug.

According to some embodiments, the second electrode is electrically connected to a bit line extending along a first direction, and the source doped region is electrically connected to a source line, wherein the source line extends along a second direction.

According to some embodiments, the first direction is orthogonal to the second direction.

Still another aspect of the present invention provides a method for forming a semiconductor memory device including: providing a substrate; forming a dielectric layer on the substrate; forming a contact plug in the dielectric layer, wherein an upper portion of the contact plug protrudes from a top surface of the dielectric layer, wherein the upper portion of the contact plug acts as a first electrode; forming a buffer layer on the dielectric layer and beside the upper portion of the contact plug; forming a resistive-switching layer beside the buffer layer; and forming a second electrode beside the resistive-switching layer.

According to some embodiments, the contact plug comprises tungsten.

According to some embodiments, the buffer layer comprises a metal or a conductive transition metal oxide.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

In the following detailed description, Mn represents the different metal layers in the metal interconnect structure, where n is a positive integer. For example, M1 represents the first metal layer in the metal interconnect structure, and M2 represents the second metal layer in the metal interconnect structure, and so on. Vn represents the different conductive vias in the metal interconnection structure. For example, V1 represents the conductive via connecting M1 to M2, and V2 represents the conductive via connecting M2 to M3, and so on.

The present invention discloses a high-density semiconductor memory device structure and layout, in particular a high-density resistive random access memory (RRAM) device structure and layout. One specific technical feature is that a protruding upper portion of a contact plug, which is electrically connected to a drain doped region of a transistor, serves as the first electrode of the memory storage structure. The resistive-switching layer and the second electrode are arranged in a recessed area beside the protruding upper portion of the contact plug. In this way, the first electrode, the resistive-switching layer and the second electrode form a horizontal configuration.

Figure 1:
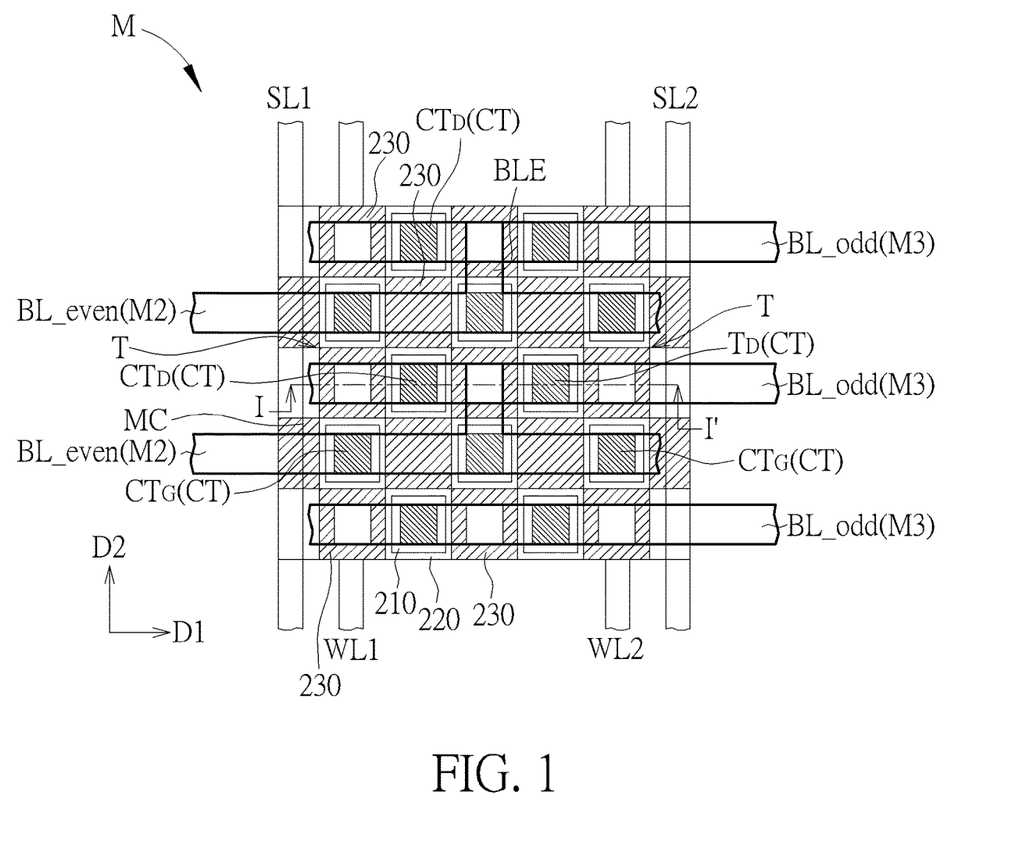
FIG. 1 is a schematic diagram showing an exemplary memory layout according to an embodiment of the present invention.
Figure 2:
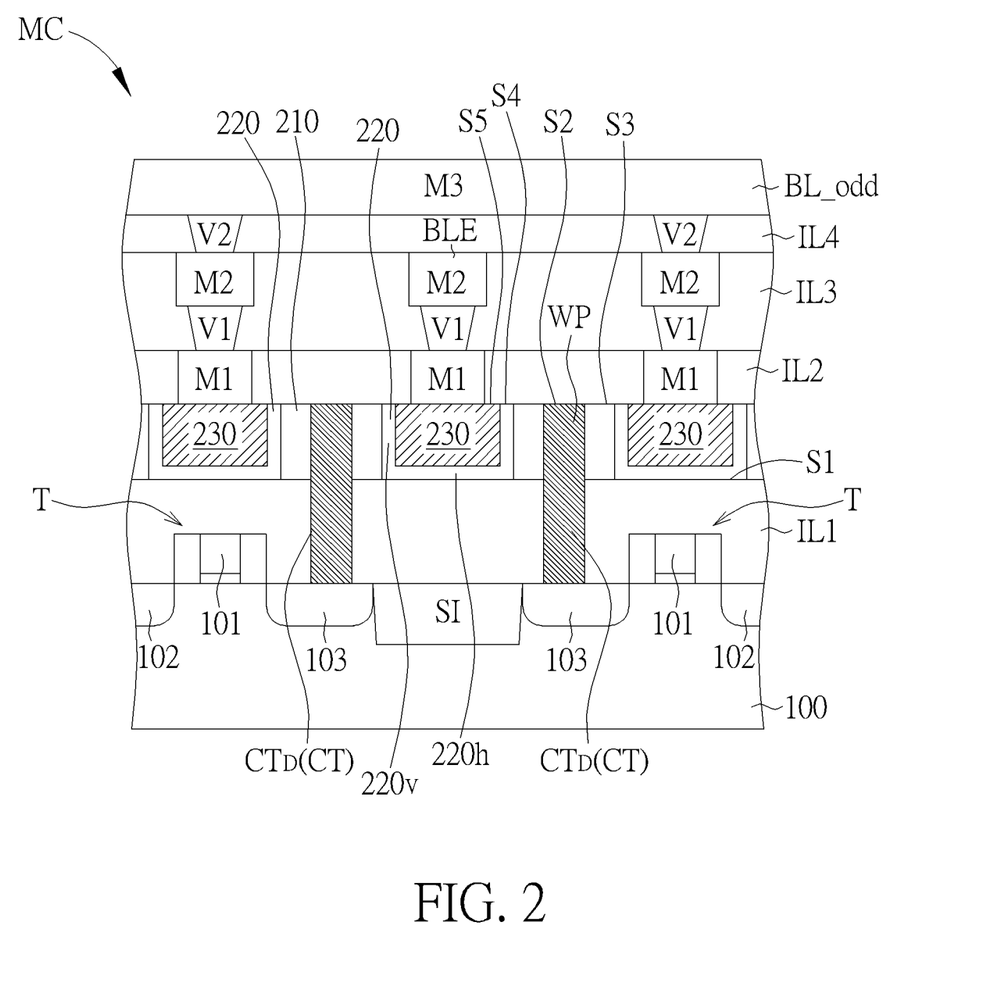
FIG. 2 is a schematic cross-sectional view taken along line I-I' in FIG. 1.

Please refer to FIG. 1 and FIG. 2. FIG. 1 is a schematic diagram of a single transistor dual resistor (1T2R) memory layout according to an embodiment of the present invention. FIG. 2 is a schematic diagram showing a cross-sectional view taken along line I-I' in FIG. 1. As shown in FIG. 1 and FIG. 2, the memory layout M is composed of a plurality of 1T2R memory cells MC. According to an embodiment of the present invention, the memory layout M includes a plurality of contact plugs CT arranged in a checkerboard pattern. The contact plugs CT includes a plurality of contact plugs $CT_D$ respectively and electrically connected to the drain doped regions 103 of the transistors T, and a plurality of contact plugs $CT_G$ are alternately arranged with the contact plugs $CT_D$ in a staggered manner. According to an embodiment of the present invention, each of the transistors T includes a gate electrode 101, a source doped region 102 and a drain doped region 103. According to an embodiment of the present invention, the contact plug $CT_D$ electrically connected to the drain doped region 103 serves as a first electrode of the memory storage structure.

According to an embodiment of the present invention, the memory layout M further includes a plurality of odd-numbered row bit lines BL_odd (only three are shown illustratively in the figure) and even-numbered row bit lines BL_even (only two are shown illustratively in the figure) extending along a first direction D1. According to an embodiment of the present invention, the odd-numbered row bit lines BL_odd and the even-numbered row bit lines BL_even may be arranged in different metal interconnection layers. According to an embodiment of the present invention, for example, the odd-numbered row bit lines BL_odd may be provided in the M3 metal layer, and the even-numbered row bit lines BL_even may be provided in the M2 metal layer. According to an embodiment of the present invention, the odd-numbered row bit lines BL_odd and the even-numbered row bit lines BL_even may be electrically connected to the second electrodes 230 of the memory storage structures, respectively.

According to an embodiment of the present invention, the memory layout M further includes a plurality of word lines, for example, word lines WL1 and WL2, extending along a second direction D2 (only two are shown as an example in the figure), and a plurality of source lines, for example, source lines SL1 and SL2, extending along the second direction D2 and electrically connected to the source doped regions 102 of the transistors T (only two are shown as an example in the figure). According to an embodiment of the present invention, the word lines WL1 and WL2 may be polysilicon word lines, but not limited thereto. According to an embodiment of the present invention, the source lines SL1 and SL2 may be heavily doped regions provided in the substrate 100, for example, $N^+$ doped regions. According to an embodiment of the present invention, the first direction D1 is orthogonal to the second direction D2.

According to an embodiment of the present invention, the memory layout M further includes a buffer layer 210 surrounding the protruding upper portion WP of each contact plug CT. According to an embodiment of the present invention, the memory layout M further includes a resistive-switching layer 220 surrounding the buffer layer 210. According to an embodiment of the present invention, the second electrode 230 is located beside the resistive-switching layer 220. According to an embodiment of the present invention, the second electrode 230 may comprise titanium nitride (TiN) or tantalum nitride (TaN).

It can be seen from FIG. 2 that the memory cell MC of the present invention includes a substrate 100, for example, a silicon substrate. The source doped region 102 and the drain doped region 103 of the transistor T are arranged in the substrate 100. In addition, there may be an isolation structure SI in the substrate 100 to isolate adjacent transistor devices. The memory cell MC further includes a dielectric layer IL1 such as a silicon oxide layer, on the substrate 100. According to an embodiment of the present invention, the contact plugs CT are located in the dielectric layer IL1 and an upper portion WP of each contact plug CT protrudes from a top surface S1 of the dielectric layer IL1. As mentioned above, the upper portion WP of each contact plug CT serves as the first electrode of the memory storage structure. According to an embodiment of the present invention, the contact plugs CT may include tungsten, but is not limited thereto.

According to an embodiment of the present invention, the buffer layer 210 is located on the dielectric layer IL1 and is beside each contact plug CT. The buffer layer 210 surrounds the upper portion WP of the contact plug CT. According to an embodiment of the present invention, the buffer layer 210 is a spacer buffer layer. According to an embodiment of the present invention, the buffer layer 210 may include a metal or a conductive transition metal oxide. According to an embodiment of the present invention, the aforementioned metal may include aluminum (Al), titanium (Ti), tantalum (Ta), gold (Au), silver (Ag), platinum (Pt), tungsten (W), nickel (Ni), iridium (Ir), or copper (Cu), but is not limited thereto. According to an embodiment of the present invention, the aforementioned conductive transition metal oxide may include nickel oxide ($NiO_x$), tantalum oxide ($Ta_yO_x$), titanium oxide ($TiO_x$), hafnium oxide ($HfO_x$), tungsten oxide ($WO_x$) zirconium oxide ($ZrO_x$), aluminum oxide ($Al_yO_x$), strontium titanate ($SrTiO_x$), niobium oxide ($Nb_yO_x$), or yttrium oxide ($Y_yO_x$), but is not limited thereto.

According to an embodiment of the present invention, a top surface S2 of the upper portion WP of each contact plug CT is coplanar with a top surface S3 of the buffer layer 210, a top surface S4 of the resistive-switching layer 220, and a top surface S5 of the second electrode 230. According to an embodiment of the present invention, the resistive-switching layer 220 has a vertical portion 220v on the buffer layer 210 and a horizontal portion 220h on the dielectric layer IL1. According to an embodiment of the present invention, the vertical portion 220v directly contacts the buffer layer 210, and the horizontal portion 220h directly contacts the dielectric layer IL1.

According to an embodiment of the present invention, a dielectric layer IL2 may be provided on the dielectric layer ILL for example, a low dielectric constant material layer, but it is not limited thereto. According to an embodiment of the present invention, an M1 metal layer may be formed in the dielectric layer IL2. According to an embodiment of the present invention, the M1 metal layer comprises a plurality of metal pads, which are respectively disposed on the corresponding second electrodes 230. According to an embodiment of the present invention, a dielectric layer IL3 may be provided on the dielectric layer IL2, for example, a low dielectric constant material layer, but it is not limited thereto. According to an embodiment of the present invention, an M2 metal layer and a V1 conductive via may be formed in the dielectric layer IL3. According to an embodiment of the present invention, a dielectric layer IL4 may be provided on the dielectric layer IL3, for example, a low dielectric constant material layer, but it is not limited thereto. According to an embodiment of the present invention, an M3 metal layer and a V2 conductive via may be formed in the dielectric layer IL4. According to an embodiment of the present invention, the second electrode 203 located directly above the gate electrode 101 of the transistor T is electrically connected to an odd-numbered row bit line BL_odd in the M3 metal layer through the M1 metal layer, the V1 conductive via, the M2 metal layer and the V2 conductive via. According to an embodiment of the present invention, the second electrode 230 located between the drain doped regions 103 of two adjacent transistors T is electrically connected to an even-numbered row bit lines BL_even located in the M2 metal layer through the M1 metal layer and the V1 conductive via.

It can be seen from FIG. 1 that the odd-numbered row bit line BL_odd and the even-numbered row bit line BL_even do not overlap each other, and the even-numbered row bit line BL_even is electrically connected to the second electrode 230 located between the drain doped regions 103 of two adjacent transistors T through an extension BLE extending along the second direction D2. According to an embodiment of the present invention, the second electrodes 230 on the same row are respectively and electrically connected to the odd-numbered row bit line BL_odd and the even-numbered row bit line BL_even extending along the first direction D1. The source doped regions 102 of the transistors T are respectively and electrically connected to the source lines SL1 and SL2, which are located in the substrate 100 and extend along the second direction D2.

Figure 3:
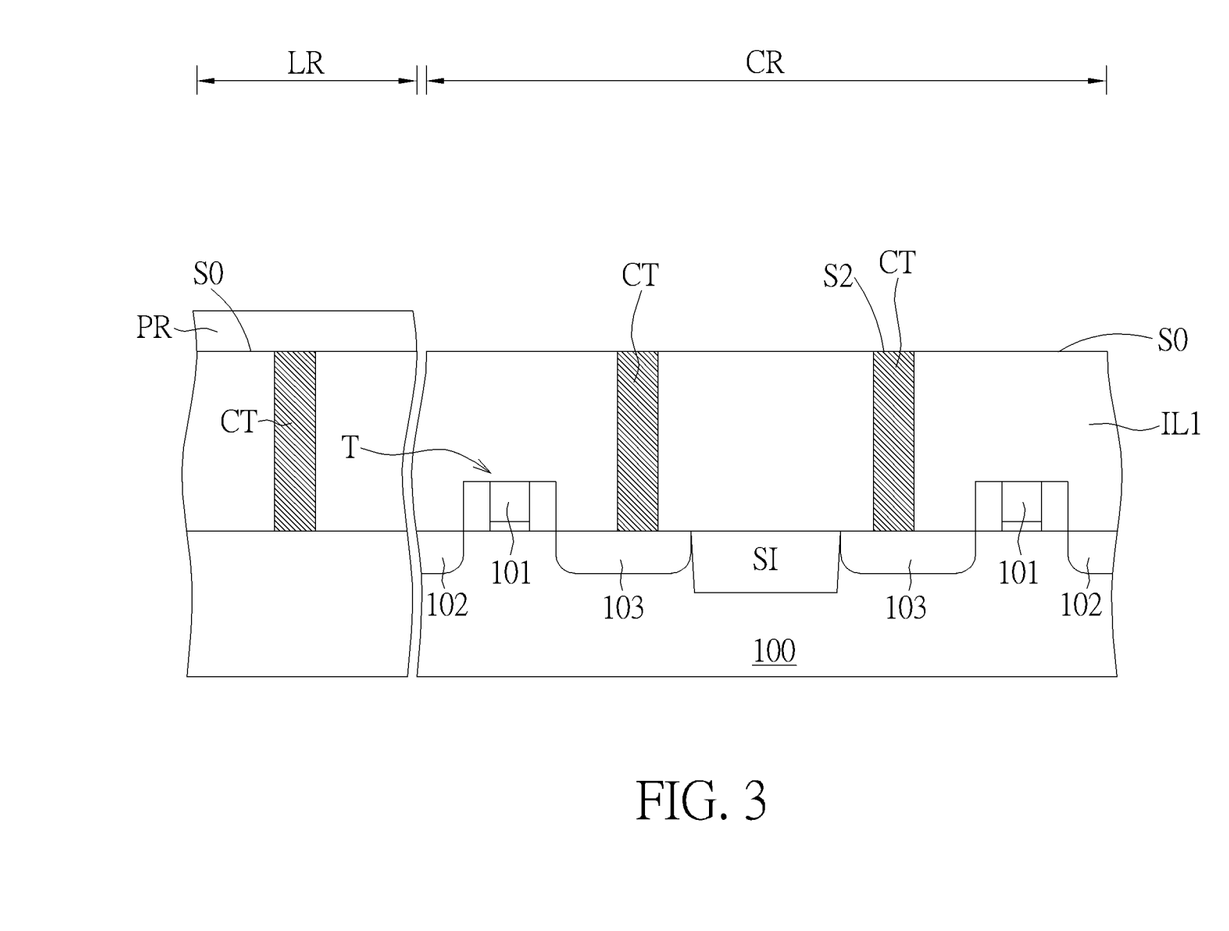
FIG. 3 to FIG. 9 are schematic diagrams showing a method of forming a semiconductor memory device according to an embodiment of the present invention.

Please refer to FIG. 3 to FIG. 9, which are schematic diagrams showing a method for forming a semiconductor memory device according to an embodiment of the present invention, wherein like regions, layers or components are represented by like numeral numbers or labels. As shown in FIG. 3, a substrate 100, for example, a silicon substrate is provided. The substrate 100 includes a logic circuit area LR and a memory array area CR. At least a transistor T is formed on the substrate 100 and includes a gate electrode 101, a source doped region 102 and a drain doped region 103. There may be an isolation structure SI in the substrate 100 to isolate adjacent transistor devices. A dielectric layer IL1 is formed on the substrate 100, for example, a silicon oxide layer, but it is not limited thereto. In the dielectric layer ILL a plurality of contact plugs CT may be formed. At this point, the top surface S0 of the dielectric layer IL1 and the top surface S2 of each contact plug CT are coplanar. Next, a photoresist pattern PR is formed on the dielectric layer IL1. The photoresist pattern PR covers the logic circuit area LR, while the memory array area CR is exposed.

Figure 4:
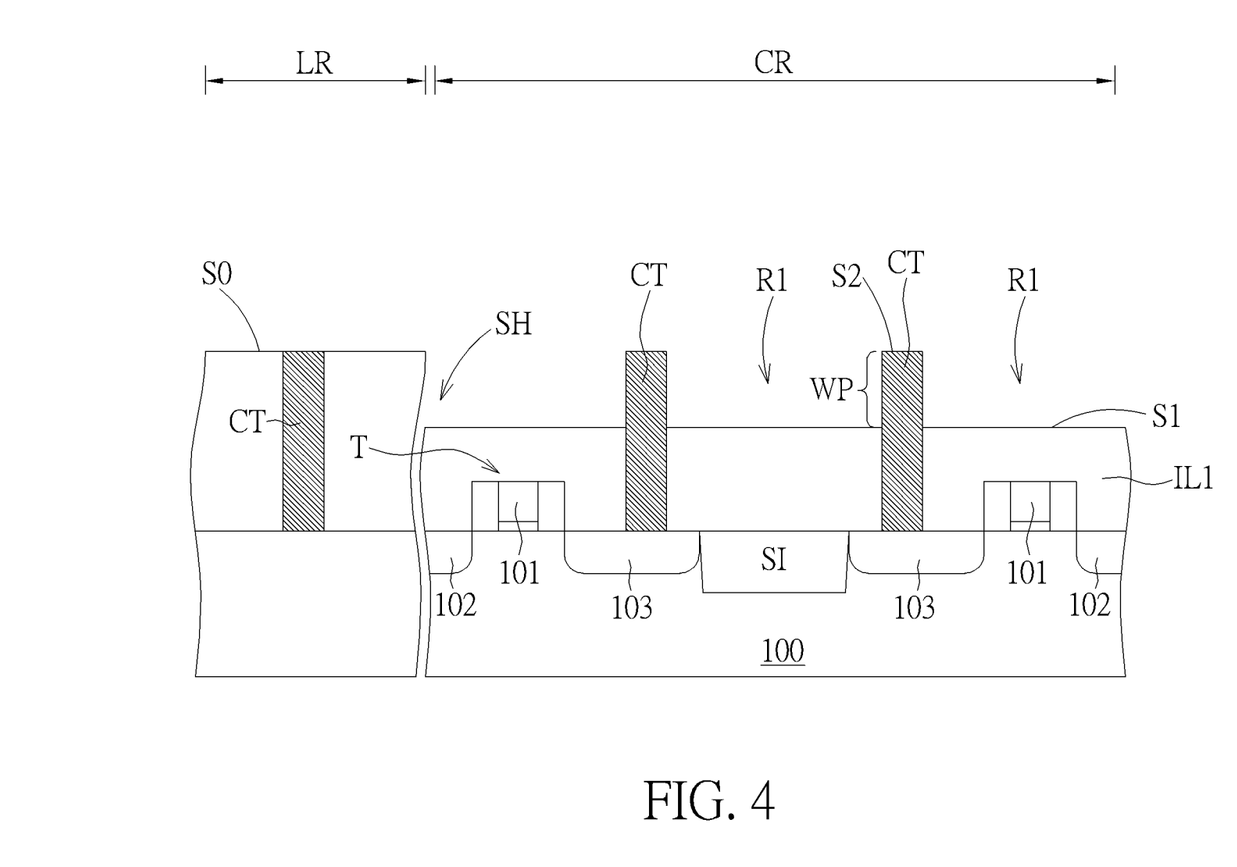

As shown in FIG. 4, subsequently, using the photoresist pattern PR as an etching resist mask, an etching process, for example, a dry etching process is performed to partially etch away the exposed dielectric layer IL1 in the memory array area CR, thereby forming a recessed area R1. Next, the remaining photoresist pattern PR is removed. At this point, the top surface S1 of the dielectric layer IL1 in the memory array area CR is lower than the top surface S2 of each contact plug CT and the top surface S0 of the dielectric layer IL1 in the logic circuit area LR. A step height SH is formed at the interface between the logic circuit area LR and the memory array area CR. In the memory array area CR, the upper portion WP of each contact plug CT protrudes from the top surface S1 of the dielectric layer IL1. As mentioned above, the upper portion WP of each contact plug CT serves as the first electrode. Subsequently, a cleaning process can be performed to remove unwanted oxides.

Figure 5:
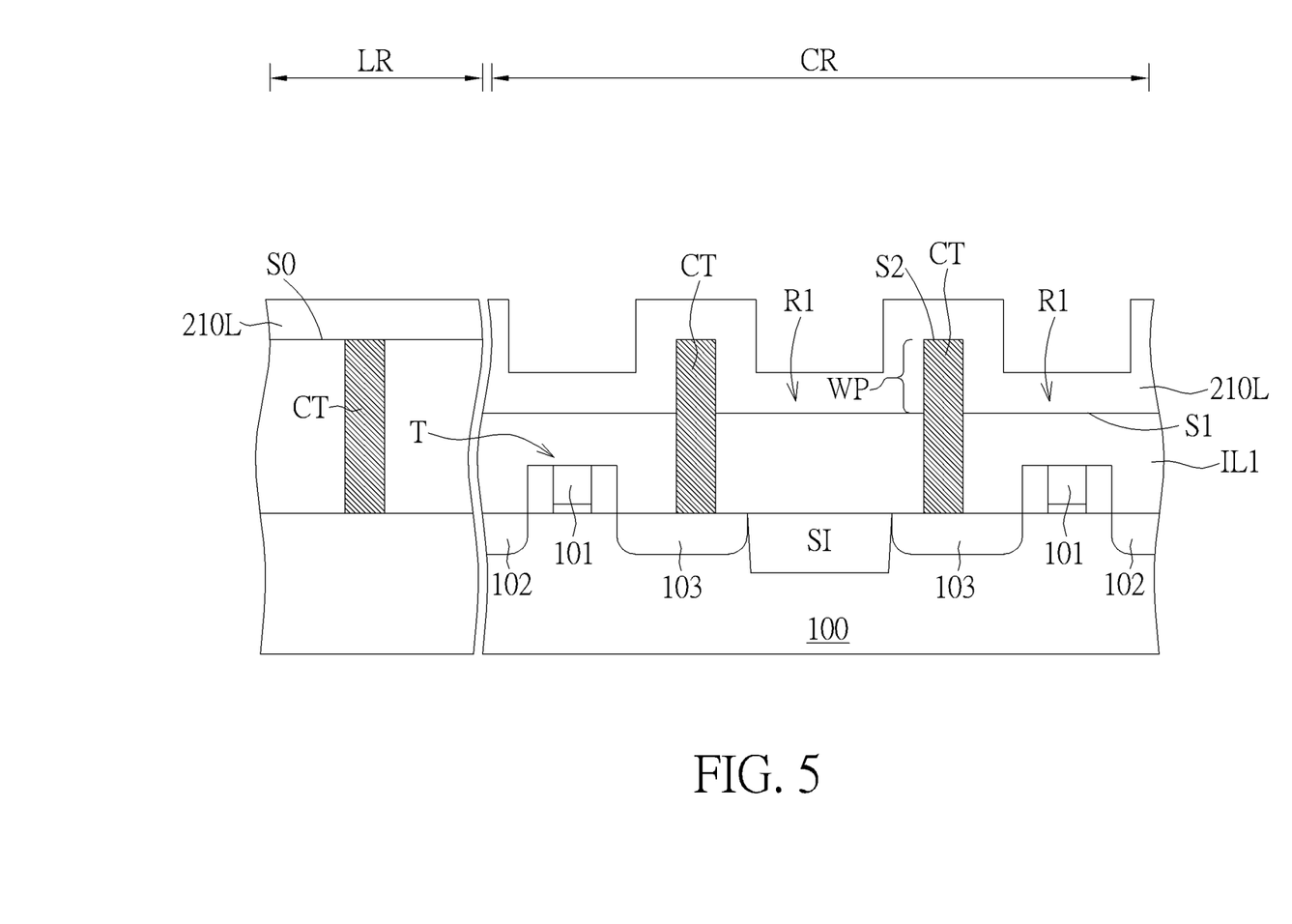

As shown in FIG. 5, a buffer layer 210L is then deposited in a blanket manner, such that the buffer layer 210L conformally covers the logic circuit area LR and the memory array area CR. According to an embodiment of the present invention, the method of depositing the buffer layer 210L may include, but is not limited to, an atomic layer deposition (ALD) method, a chemical vapor deposition (CVD) method, or a physical vapor deposition (PVD) method. In the memory array area CR, the upper portion WP of each contact plug CT protrudes from the top surface S1 of the dielectric layer IL1, so the buffer layer 210L covers the upper portion WP of each contact plug CT in a conformal manner, thereby forming a protruding structure in the memory array area CR. According to an embodiment of the present invention, the buffer layer 210L may include a metal or a conductive transition metal oxide. For example, the aforesaid metal may include aluminum, titanium, tantalum, gold, silver, platinum, tungsten, nickel, iridium, or copper. The aforesaid conductive transition metal oxide may include nickel oxide, tantalum oxide, titanium oxide, hafnium oxide, tungsten oxide, zirconium oxide, aluminum oxide, strontium titanate, niobium oxide, or yttrium oxide.

Figure 6:
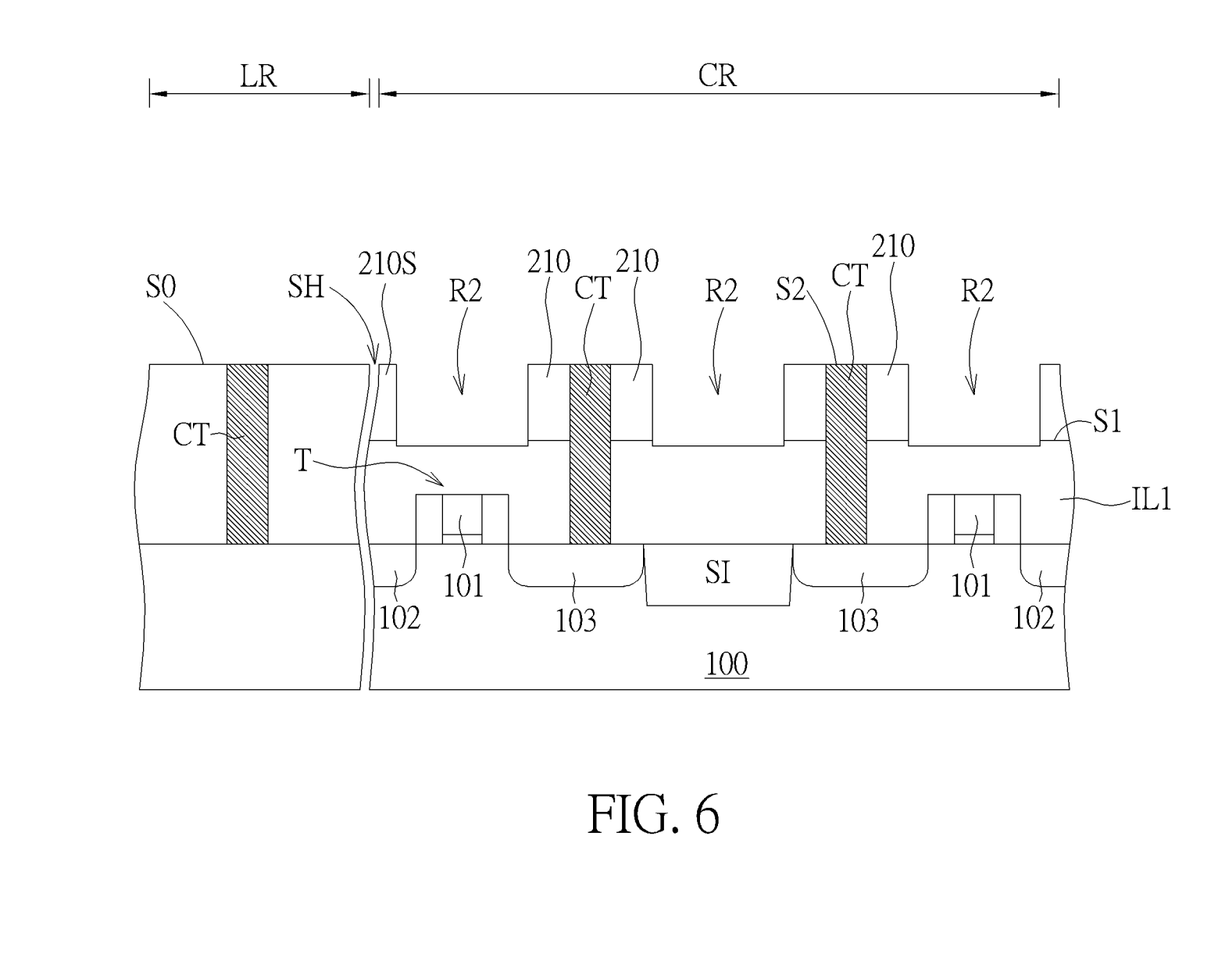

As shown in FIG. 6, after the buffer layer 210L is deposited, an etch-back process is then performed on the buffer layer 210L, such as dry etching or ion milling, so that a spacer buffer layer 210 is formed on a sidewall of the upper portion WP of each contact plug CT. According to an embodiment of the present invention, a spacer buffer layer 210S is formed on the step height SH at the interface between the logic circuit area LR and the memory array area CR. At this point, a recessed region R2 is formed between the spacer buffer layer 210 and the top surface S1 of the dielectric layer IL1.

Figure 7:
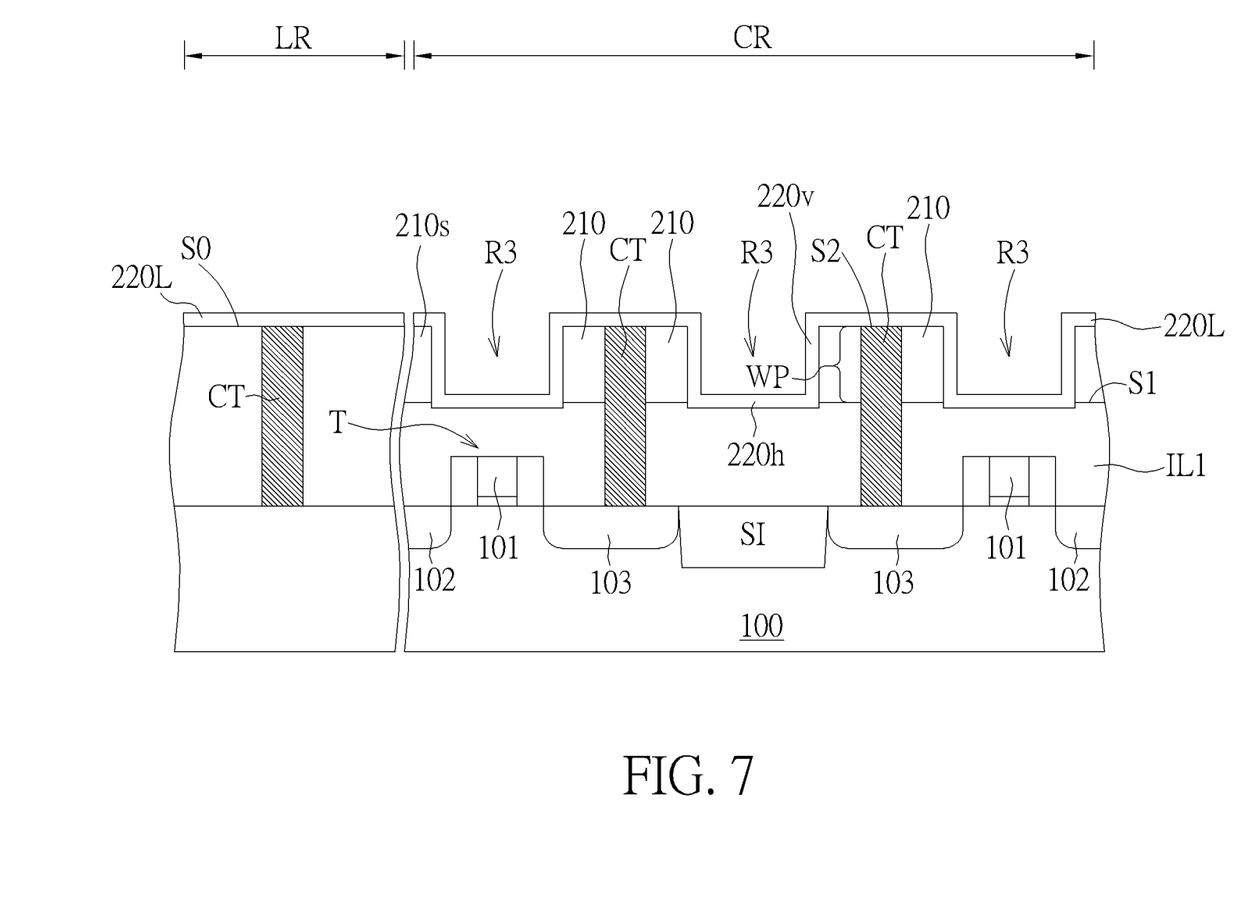

As shown in FIG. 7, a resistive-switching layer 220L is then deposited in a blanket manner, so that the resistive-switching layer 220L conformally covers the logic circuit area LR and the memory array area CR. According to an embodiment of the present invention, the method of depositing the resistive-switching layer 220L may include, but is not limited to, an ALD method, a CVD method, or a PVD method. According to an embodiment of the present invention, the resistive-switching layer 220L may include nickel oxide ($NiO_x$), tantalum oxide ($Ta_yO_x$), titanium oxide ($TiO_x$), hafnium oxide ($HfO_x$), tungsten oxide ($WO_x$), zirconium oxide ($ZrO_x$), aluminum oxide ($Al_yO_x$), strontium titanate ($SrTiO_x$), niobium oxide ($Nb_yO_x$), or yttrium oxide ($Y_yO_x$). According to an embodiment of the present invention, the resistive-switching layer 220L may have a vertical portion 220v on the buffer layer 210 and a horizontal portion 220h on the dielectric layer IL1. According to an embodiment of the present invention, the resistive-switching layer 220L is deposited conformally in the recessed area R2, and a recessed area R3 is formed on the surface of the resistive-switching layer 220L.

Figure 8:
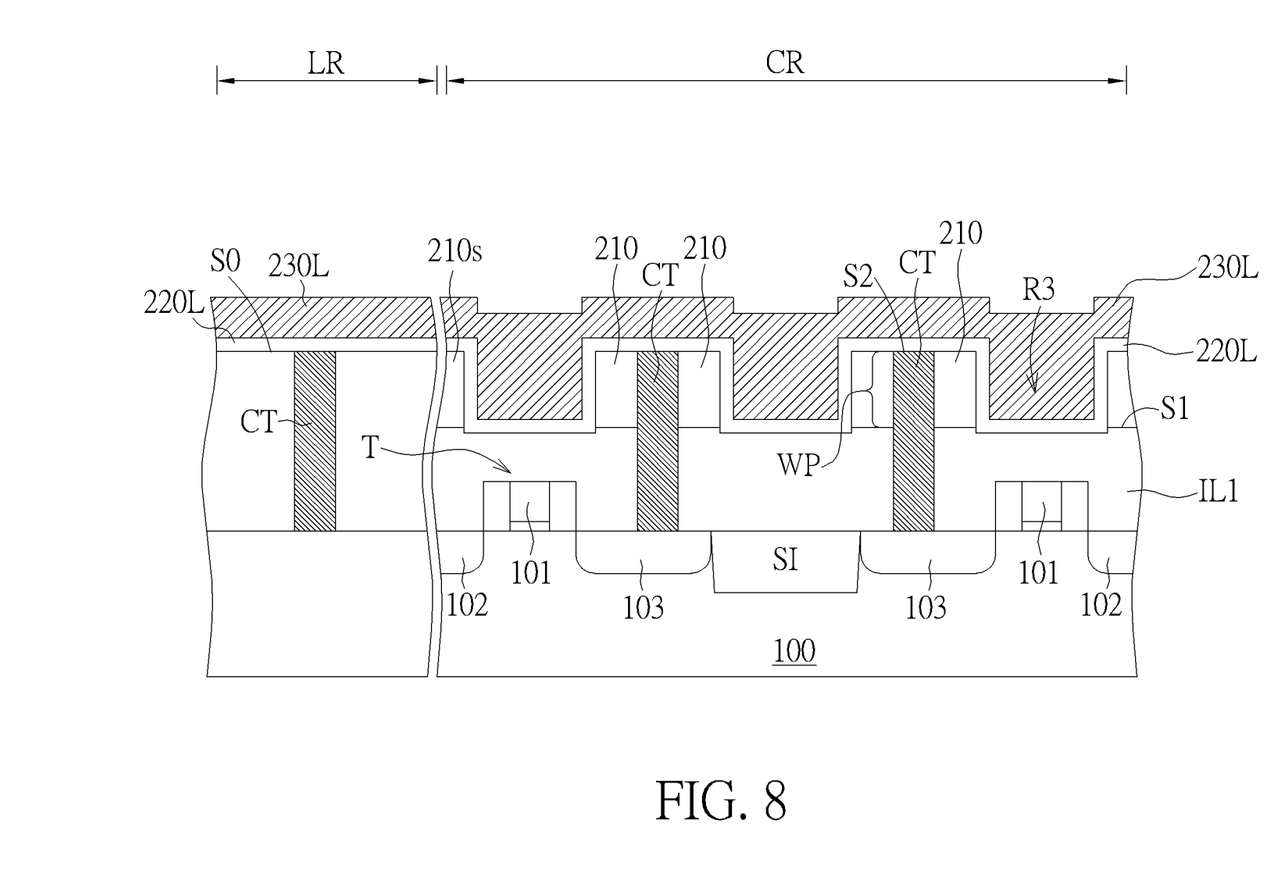

As shown in FIG. 8, a second electrode layer 230L is then deposited on the resistive-switching layer 220L in the logic circuit area LR and the memory array area CR. According to an embodiment of the present invention, the second electrode layer 230L may fill the recessed area R3 on the surface of the resistive-switching layer 220L. According to an embodiment of the present invention, for example, the second electrode layer 230L may include titanium nitride or tantalum nitride. According to an embodiment of the present invention, the method of forming the second electrode layer 230L may include, but is not limited to, an ALD method, a CVD method, or a PVD method.

Figure 9:
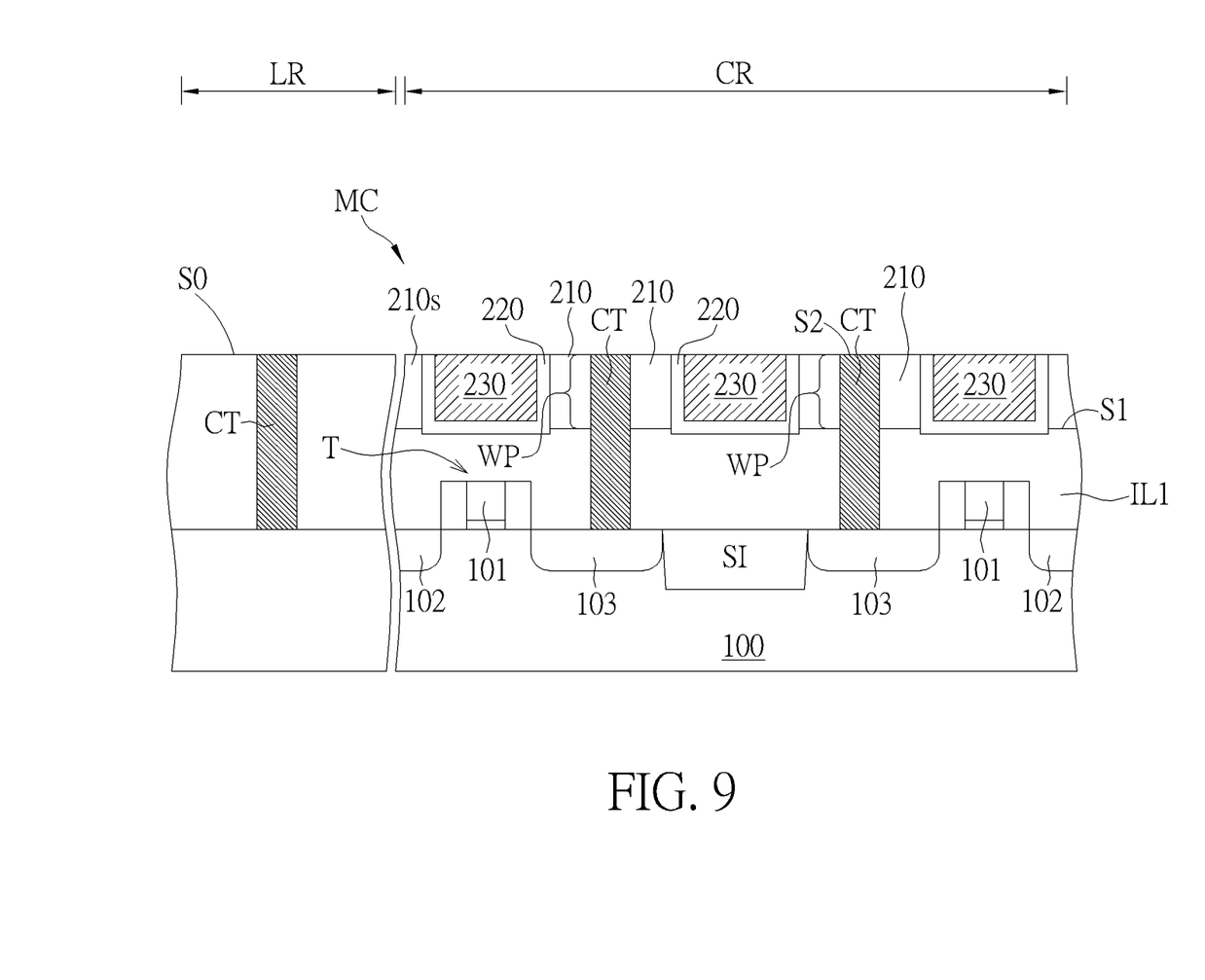

As shown in FIG. 9, a planarization process, for example, a chemical mechanical polishing (CMP) process, is performed to polish away a part of the second electrode layer 230L and the resistive-switching layer 220L, thereby forming the memory cell MC. The subsequent process steps include the deposition of the dielectric layer and the fabrication of the metal interconnection structure (including the bit lines), which are well known to those skilled in the art, and therefore will not be described in detail. The memory cell MC of the present invention includes a substrate 100, a dielectric layer IL1 located on the substrate 100, and a contact plug CT located in the dielectric layer IL1. The upper portion WP of the contact plug CT protrudes from the top surface S1 of the dielectric layer IL1. The upper portion WP of the contact plug CT serves as the first electrode. A buffer layer 210 is located on the dielectric layer IL1 and beside the contact plug CT. A resistive-switching layer 220 is located next to the buffer layer 210. A second electrode 230 is located next to the resistive-switching layer 220.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate;
   a dielectric layer on the substrate;
   a contact plug in the dielectric layer, wherein an upper portion of the contact plug protrudes from a top surface of the dielectric layer, wherein the upper portion of the contact plug acts as a first electrode;
   a buffer layer on the dielectric layer and beside the upper portion of the contact plug;
   a resistive-switching layer beside the buffer layer; and
   a second electrode beside the resistive-switching layer.

2. The semiconductor memory device according to claim 1, wherein the contact plug is electrically connected to a drain doped region of a transistor on the substrate, wherein the transistor comprises a gate electrode, a source doped region and the drain doped region.

3. The semiconductor memory device according to claim 2, wherein the second electrode is electrically connected to a bit line extending along a first direction, and the source doped region is electrically connected to a source line in the substrate, wherein the source line extends along a second direction.

4. The semiconductor memory device according to claim 3, wherein the first direction is orthogonal to the second direction.

5. The semiconductor memory device according to claim 1, wherein a top surface of the upper portion of the contact plug is coplanar with a top surface of the buffer layer, a top surface of the resistive-switching layer, and a top surface of the second electrode.

6. The semiconductor memory device according to claim 1, wherein the buffer layer is a spacer buffer layer surrounding the upper portion of the contact plug.

7. The semiconductor memory device according to claim 6, wherein the resistive-switching layer comprises a vertical portion on the spacer buffer layer and a horizontal portion on the dielectric layer.

8. The semiconductor memory device according to claim 1, wherein the contact plug comprises tungsten.

9. The semiconductor memory device according to claim 1, wherein the buffer layer comprises a metal or a conductive transition metal oxide.

10. The semiconductor memory device according to claim 9, wherein the metal comprises Al, Ti, Ta, Au, Ag, Pt, W, Ni, Ir or Cu.

11. The semiconductor memory device according to claim 9, wherein the conductive transition metal oxide comprises $NiO_x$, $Ta_yO_x$, $TiO_x$, $HfO_x$, $WO_x$, $ZrO_x$, $Al_yO_x$, $SrTiO_x$, $Nb_yO_x$, or $Y_yO_x$.

12. The semiconductor memory device according to claim 1, wherein the resistive-switching layer comprises $NiO_x$, $Ta_yO_x$, $TiO_x$, $HfO_x$, $WO_x$, $ZrO_x$, $Al_yO_x$, $SrTiO_x$, $Nb_yO_x$, or $Y_yO_x$.

13. The semiconductor memory device according to claim 1, wherein the second electrode comprises TiN or TaN.

14. A memory layout, comprising:
   a transistor comprising a source doped region and a drain doped region;
   a contact plug on the drain doped region, wherein the contact plug acts as a first electrode;
   a buffer layer surrounding the contact plug;
   a resistive-switching layer surrounding the buffer layer; and a second electrode beside the resistive-switching layer.

15. The memory layout according to claim 14, wherein the buffer layer is a spacer buffer layer surrounding an upper portion of the contact plug.

16. The memory layout according to claim 14, wherein the second electrode is electrically connected to a bit line extending along a first direction, and the source doped region is electrically connected to a source line, wherein the source line extends along a second direction.

17. The memory layout according to claim 16, wherein the first direction is orthogonal to the second direction.

18. A method for forming a semiconductor memory device, comprising:
   providing a substrate;
   forming a dielectric layer on the substrate;
   forming a contact plug in the dielectric layer, wherein an upper portion of the contact plug protrudes from a top surface of the dielectric layer, wherein the upper portion of the contact plug acts as a first electrode;
   forming a buffer layer on the dielectric layer and beside the upper portion of the contact plug;
   forming a resistive-switching layer beside the buffer layer; and
   forming a second electrode beside the resistive-switching layer.

19. The method according to claim 18, wherein the contact plug comprises tungsten.

20. The method according to claim 18, wherein the buffer layer comprises a metal or a conductive transition metal oxide.

\* \* \* \* \*